United States Patent [19]

Temes et al.

[11] Patent Number: 4,543,534
[45] Date of Patent: Sep. 24, 1985

[54] OFFSET COMPENSATED SWITCHED CAPACITOR CIRCUITS

[75] Inventors: Gabor C. Temes; Kenneth W. Martin, both of Los Angeles, Calif.

[73] Assignee: The Regeants of University of Calif., Berkeley, Calif.

[21] Appl. No.: 607,254

[22] Filed: May 4, 1984

[51] Int. Cl.⁴ .............................................. H03F 1/14
[52] U.S. Cl. ......................................... 330/9; 330/51; 330/109
[58] Field of Search ...................... 330/9, 51, 107, 109; 340/347 DA, 347 CC

[56] References Cited

U.S. PATENT DOCUMENTS 3,611,356 10/1971 Jensen ........................ 340/347 DA
4,306,196 12/1981 Dwarakanath et al. ................ 330/9
4,393,351  7/1983 Gregorian et al. .................. 330/9 X Primary Examiner—James B. Mullins
Assistant Examiner—Steven J. Mottola
Attorney, Agent, or Firm—Poms, Smith, Lande & Rose

[57] ABSTRACT

A switched capacitor type amplifier system including an operational amplifier is provided with compensating capacitive coupling during the non-sampling portion of the cycle from the output of the operational amplifier to its input, to avoid output discontinuities, and to provide compensation for the offset voltage of the operational amplifier. The circuit includes a two phase clock, with the signal input to the input capacitor being alternately sampled and blocked, and the capacitive compensation circuit mentioned above being alternately blocked and connected, respectively, during successive phases of the clock operation. Special circuitry for preventing "clock feed-through" and for implementing a Multiplying Digital to Analog Converter, or MDAC, are disclosed.

17 Claims, 6 Drawing Figures

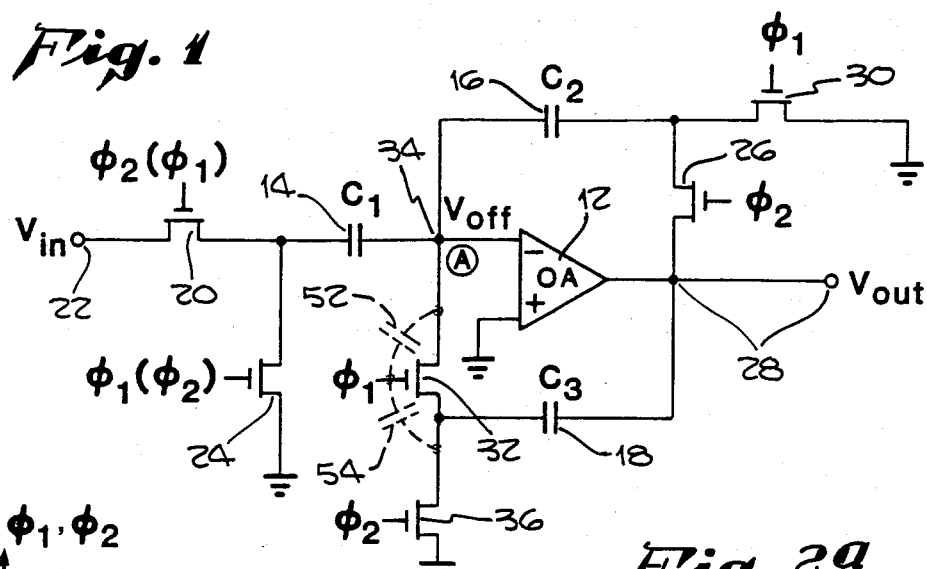
Fig. 1
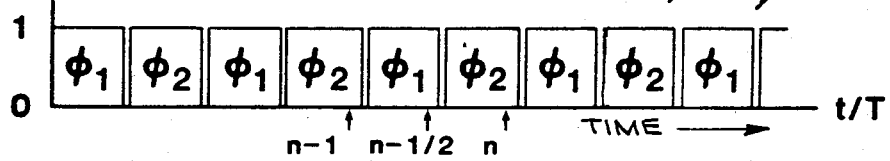
Fig. 2.a
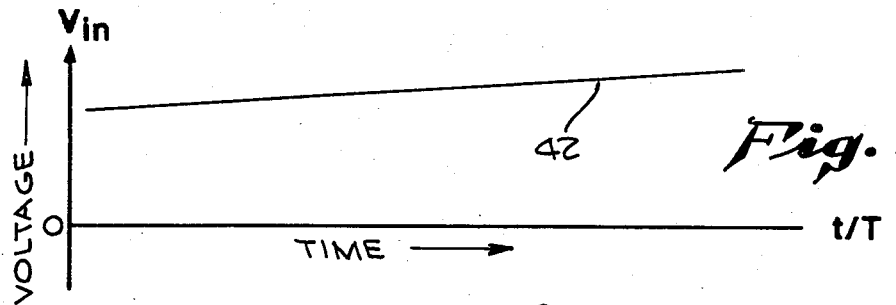
Fig. 2.b
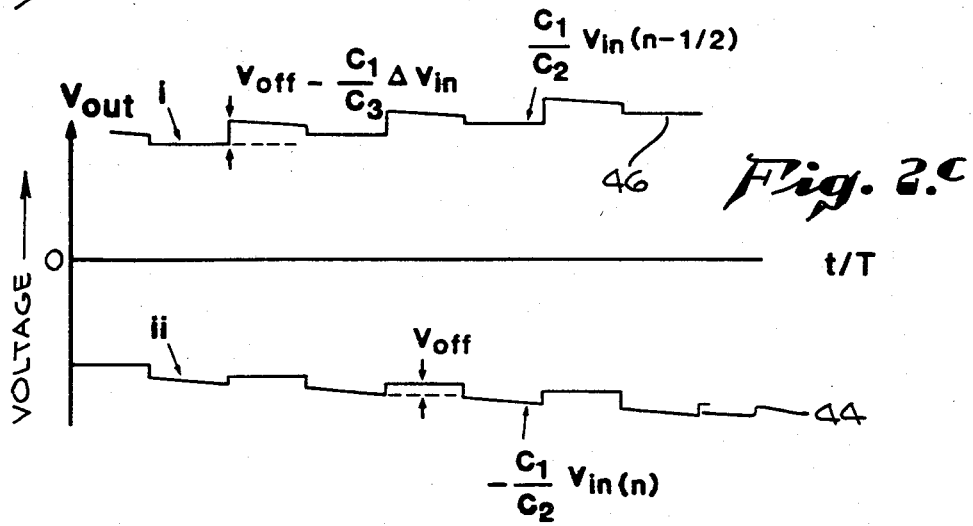
Fig. 2.c

OFFSET COMPENSATED SWITCHED CAPACITOR CIRCUITS

FIELD OF THE INVENTION

This invention relates to switched capacitor amplifier circuits.

BACKGROUND OF THE INVENTION

Switched capacitor amplifiers have become increasingly popular for use with metal oxide semiconductor (MOS) technology in which good capacitors and good operational amplifiers may be readily implemented. For background in this field, reference is made to three prior articles as follows:

(1) R. Gregorian, "High-Resolution Switched-Capacitor D/A Converter, Microelectronics Journal, Vol. 12, No. 2, pp. 10-13, 1981.
(2) R. Gregorian, An Offset-free Switched-Capacitor Biquad", Microelectronics Journal, Vol. 13, No. 4, pp. 37-40, 1982.
(3) K. Martin, "New Clock Feedthrough Cancellation Technique for Analogue MOS Switched-Capacitor Circuits", Electron, Lett., Vol. 18, No. 1, pp. 39-40, Jan. 1982, One problem which is often encountered in switched capacitor amplifiers is the error introduced by the operational amplifier offset voltage. This is the voltage which appears at the output of an operational amplifier when the positive and negative inputs to the operational amplifier are tied together; or the input voltage between the positive and negative input terminals of an operational amplifier required to produce a zero output voltage from the operational amplifier. Another problem in switched capacitor amplifiers involves the switching of the output of the circuit back to zero or to ground during each cycle of operation. In order to have an accurate output voltage during the time when the output voltage is being sampled, and to then restore the output voltage to zero each cycle, an operational amplifier with a very high slew rate is required. Thus, the sampling rate, or the rate of operation of the switched capacitor amplifier may be limited by the slew rate of the operational amplifier. In addition, the switching of the output voltage to near ground on each cycle may introduce noise into the output circuitry.

Accordingly, principal objects of the present invention are to provide an offset compensating switched capacitor amplifier in which a relatively low slew rate operational amplifier may be employed.

SUMMARY OF THE INVENTION

In accordance with the present invention, the foregoing objects are achieved by providing an additional compensation capacitor connected from the output of the operational amplifier to the active input terminal of the operational amplifier. During the sampling interval, this additional feedback or compensation capacitor is switched out of the circuit; and the input capacitor and the normal feedback capacitor are connected in circuit with the operational amplifier in the normal manner. However, during the portion of the cycle when the input signal is not being sampled, the compensation capacitor is connected from the output to the input of the operational amplifier. At this time, the circuit from the signal input to the input capcitor and from the normal feedback capacitor to the output of the operational amplifier are opened by appropriate semiconductor switches. As will be shown in greater detail below, under these conditions; the output voltage of the operational amplifier is an amplified signal, corresponding to the input signal being sampled, and free of operational amplifier voltage offset errors.

By using a series of input capacitors connected essentially in parallel, and having values of capacitance which are related to one another by powers of two, a multiplying digital-to-analog converter, or MDAC may be provided.

In addition, switching transients which might otherwise produce output signal errors, known in the field as "clock feed-through", may be eliminated by providing a compensating circuit which is essentially a duplicate of the basic switching circuit arrangements, coupled to the other input of the operational amplifier. The two "clock feed-through" signals, of opposite effect, will then cancel one another.

Other objects, features and advantages of the invention will become apparent from a consideration of the following detailed description and from the accompanying drawings.

BRIEF DESCRIPTION OF THE DRAWINGS

FIG. 1 is a circuit diagram of an amplifier circuit illustrating the principles of the present invention;

FIGS. 2a through 2c are plots showing the mode of operation of the circuit of FIG. 1;

DETAILED DESCRIPTION

Figure 3:
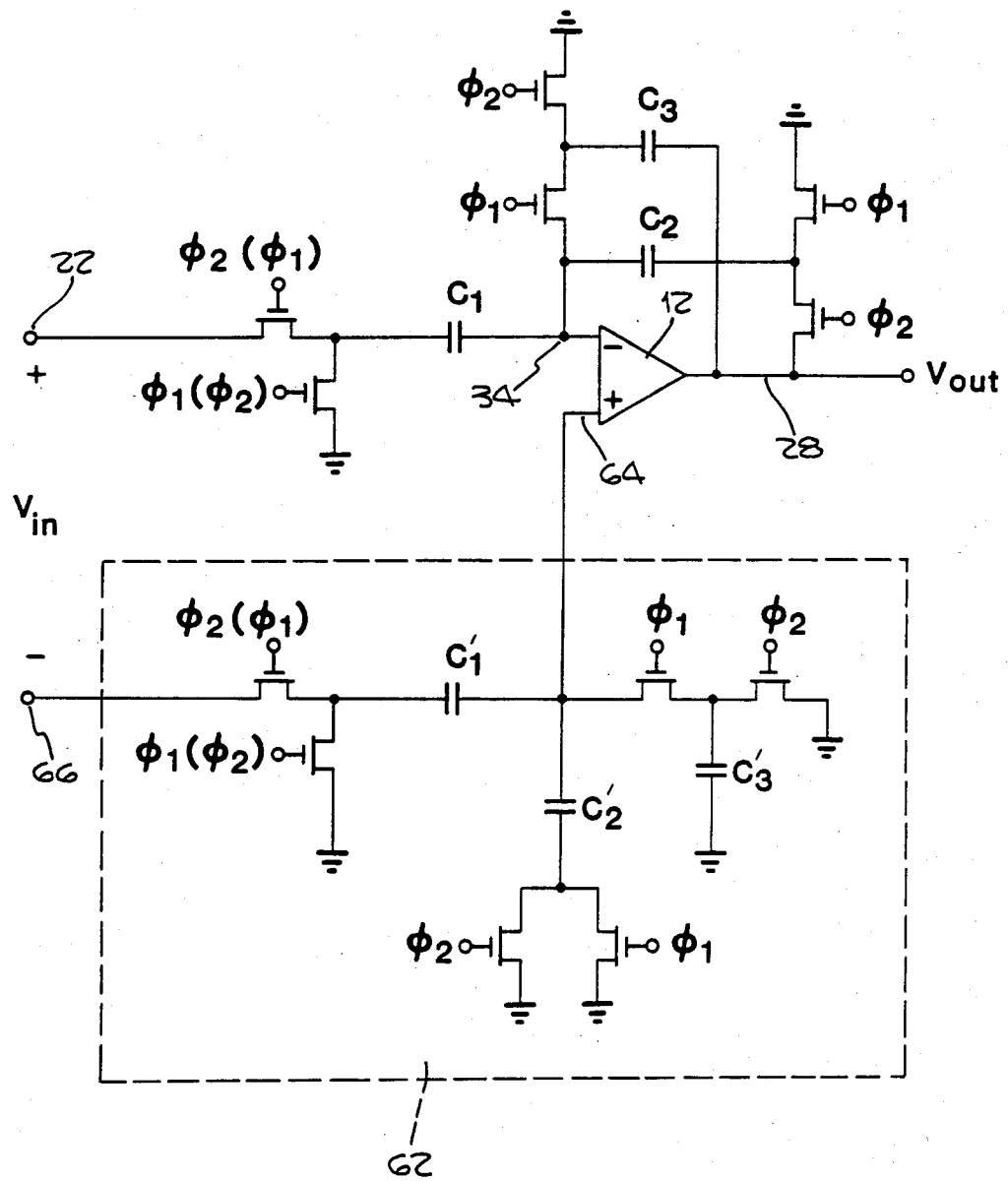
FIG. 3 is an alternative circuit arrangement including circuitry for eliminating "clock feed-through"

Referring more particularly to the drawings, FIG. 1 shows a switched capacitor amplifier using an operational amplifier 12, an input capacitor 14, a normal feedback capacitor 16, and a compensation feedback capacitor 18. The switching in the present circuit is accomplished by a series of field effect transistors, including transistor 20 between the input terminal 22 and the capacitor 14, field effect transistor 24 for grounding the input capacitor 14, field effect transistor 26 for coupling the feedback capacitor 16 to the output 28 from the operational amplifier 12, transistor 30 for grounding the output side of the capacitor 16, field effect transistor 32 for coupling the compensation capacitor 18 to the active input 34 to the operational amplifier 12, and transistor 36 for grounding compensating capacitor 18.

Adjacent each of the field effect transistors is a symbol $\phi_1$ or $\phi_2$. The control electrodes of these field effect transistors are operated in accordance with one of the phases of a two-phase clock, as illustrated in FIG. 2a. The clock signals selectively turn one set of field effect transistors on, and the other set of field effect transistors off. Thus, for example, when the field effect transistor 20 is turned on for input sampling, the field effect transistor 24 is turned off to avoid grounding the input signal; and similarly, when the field effect transistor 20 blocks the path from the input terminal 22 to the sampling capacitor 14, the field effect transistor 24 is turned on and grounds the input to capacitor 14. Similarly, the field effect transistors 26 and 30 are operated by alternate phases of the clock, and selectively either connect the feedback capacitor 16 to the output 28, or ground capacitor 16. Also, in a similar manner, during sampling intervals, the field effect transistor 32 blocks the circuit path from capacitor 18 to the input 34, while field effect transistor 36 grounds capacitor 18, and of course, their switching states are changed during the next clock phase, swith transistor 32 being switched on, and transistor 36 shifting to its "off" state.

For the input clock phases shown without parentheses in FIG. 1, nodal analysis of the circuit can be performed by applying the law of charge conservation to the charge transitions at the node "A", or point 34, during the time intervals following $t=(n-1)T$ and $t=(n+\frac{1}{2})T$. The following equations results from this analysis:

$$v_{out}(nT) = -(C_1/C_2)v_{in}(nT) \quad (1)$$

$$v_{out}(nT+T/2) = v_{out}(nT) + V_{off} \quad (2)$$

In the above expression, $V_{off}$ is the input referred offset voltage of the operational amplifier 12, appearing at node A, or point 34, under linear operating conditions. Equation (1) reveals that when clock phase $\phi_2$ is operative or is in the "one" state, the circuit functions as a delay-free inverting voltage amplifier, with a gain equal to $(-C_1/C_2)$. The gain and $V_{out}$ are independent of the offset voltage of the operational amplifier, $V_{off}$.

Equation (2) in turn shows that when clock phase $\phi_1$ rises to "1", the output voltage remains nearly equal to the value it had during the preceding sampling interval nT. The change is only equal to the offset voltage of the operational amplifier which is usually about 10 millivolts. Accordingly, the operational amplifier 12 need not have a high slew rate, as was required by previous types of offset-compensated circuits, such as those disclosed in the articles by Mr. R. Gregorian, cited above, in which the output voltage of the operational amplifier was switched down to a low value equal to the offset voltage of the operational amplifier during alternate clock phases.

For the clock phases shown within parentheses in FIG. 2a, a similar analysis gives the following expressions:

$$v_{out}(nT) = (C_1/C_2)V_{in}(nT-T/2) \quad (3)$$

and $$v_{out}(nT+T/2) = v_{out}(nT) + V_{off} - (C_1/C_3) \cdot [v_{in}(nT+T/2) - v_{in}(nT-T/2)] \quad (4)$$

As shown by Equation 3, the circuit now functions as a non-inverting voltage amplifier with a gain of $(+C1/C2)$ and a delay equal to T/2. As equation 4 shows, the value of the output voltage during the half cycle when $\phi_1$ is energized, differs from the value that it had during the previous half cycles by the following expression:

$$V_{off} - (C_1/C_3)[v_{in}(nT+T/2) - v_{in}(nT-T/2)] \quad (5)$$

The first term of this expression is in the order of 10 millivolts; and the second term can also be made small, of the order of from 1 to 10 millivolts, since the input voltage would normally not change by more than about 10 millivolts in one clock cycle. Hence, the output voltage need not vary much as clock phase $\phi_1$ is turned on, and the operational amplifier 12 still does not require a high slew rate.

Referring to FIGS. 2a, 2b and 2c, the clock output shown in successive intervals of time are set forth in FIG. 2a. A typical gradually increasing input voltage signal 42 is shown in FIG. 2b. FIG. 2c shows the two characteristics which may be obtained, with characteristic 44 resulting from the use of the clock phase connections indicated without parentheses at the input to the field effect transistors 20 and 24, while the characteristic 46 (non-inverting) is obtained when the clock phase connections indicated within the parentheses are employed for the transistors 20 and 24. Incidentally, the phase connections for the other transistors included in FIG. 1 remain the same.

Also shown in FIG. 1 is the stray capacitance indicated by the dashed line capacitors 52 and 54. The clock signals may be relatively large, such as 5 or 10 volts, and there may well be significant coupling through to the point 34 or to the capacitor 18, when the clock signal $\phi_1$, for example, is applied to the field effect transistor 32. However, depending on the signals which are used, this may not be a significant problem.

FIG. 3 is a circuit arrangement in which circuitry has been provided to eliminate or to compensate for the effect of "clock feed-through" of the type mentioned above, resulting from stray capacitances such as those shown at 52 and 54 in FIG. 1. In FIG. 3, the circuitry shown in FIG. 1 relating to the negative input of the operational amplifier 12 is all shown above the operational amplifier 12. These circuits include the letter designations, such as C-2 and C-3, which were used in FIG. 1. However, the additional circuitry included within the dashed line block 62 provides the compensation for "clock feed-through" which might otherwise occur. More specifically, the circuitry included within block 62 is substantially identical with that associated with the original switching circuit, but is connected to the lower positive input terminal 64 of the operational amplifier 12. Of course, the connections from the capacitors C'-2 and C'-3 to the output 28 of the operational amplifier are different from the connections for the basic circuit, and these capacitors are connected to ground, either directly, or through appropriate switching circuitry. Through these arrangements, any clock feed-through which is applied to input 34 is matched by an equal signal applied to input lead 64, so that the two signals are cancelled out and no clock feed-through appears at the output terminal 28.

Figure 4:
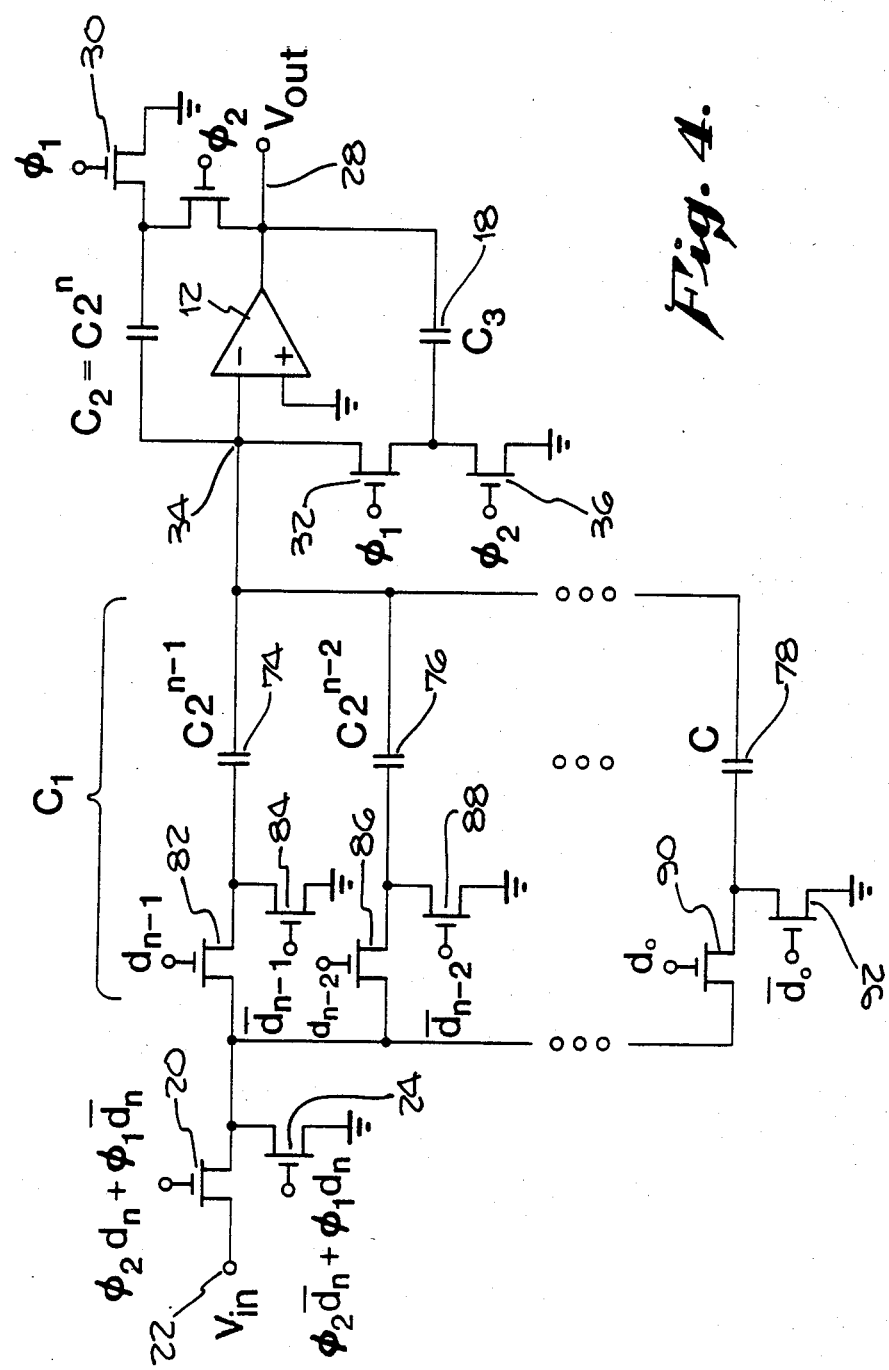
FIG. 4 is a circuit diagram of a multiplying digital-to-analog converter (MDAC) utilizing the principles of the present invention.

FIG. 4 shows the principles of the present invention applied to a multiplying digital-to-analog converter. Incidentally, in FIG. 4, all of the circuit components which are the same in FIG. 4 as in FIG. 1 bear the same reference numerals.

Now, the principal difference between the circuit of FIG. 4 and that of FIG. 1 is that, instead of a single input capacitor 14, a plurality of input capacitors 74, 76 . . . 78, are provided. Now, these various capacitors 74, 76 . . . 78 may be either brought into the circuit for active use, or may be removed from the circuit by the switching transistors 82 and 84 associated with capacitor 74, by transistors 86 and 88 associated with capacitor 76, and by additional switching transistors such as transistor 90 and 92 associated with the smallest capacitor 78. More specifically, for example, a binary "1" could be represented by placing the capacitor 78 in circuit by turning on transistor 90 and turning off transistor 92; and a binary "0" represented by the alternate conduction status of these two transistors. Accordingly, by maintaining a fixed voltage at input terminal 22, the output voltage may be set in a binary manner by including or removing one or any combination of the capacitors 74, 76 . . . 78 from the switching circuit. Thus, with capacitor 78 having a predetermined value of C, and each of the other capacitors having larger values of capacitance by a factor of a power of 2, a binary array has been developed with the more significant digits of the binary number or the binary array being represented by the larger capacitors. If desired, the switches 20 and 24 may implement a sign bit $d_n$ as shown in FIG. 4.

Also, a source of varying input voltage may be applied to terminal 22, in addition to or instead of varying the capacitors which are included in the circuit. Accordingly, the circuit of FIG. 4 is what is known as a multiplying digital-to-analog converter, or an MDAC.

In conclusion, it is to be understood that the foregoing detailed description and the accompanying drawings are illustrative of a preferred embodiment of the invention. The principles of the invention may be implemented by arrangements including somewhat different switching circuits for accomplishing the same purposes, and may be applicable to other types of switched capacitor circuits, such as switched capacitor integrator or switched capacitor filter circuits, by way of specific examples, but not of limitation. In addition, other types of logic or switching circuits may be employed to implement the disclosed functions. Accordingly, the present invention is not limited to the specific circuits shown and described hereinabove.

What is claimed is:

1. A low slew rate switched capacitor system including sampling and reset intervals during each cycle of operation of said system, comprising:
   an operational amplifier;
   an input capacitor connected to one input of said operational amplifier;
   means for receiving a source of input signals to be amplified and applying such signals to said input capacitor;
   a feedback capacitor connected in circuit between the said one input and the output of said operational amplifier;
   a compensating capacitor connected in a second circuit between the output of said operational amplifier and said one input to said operational amplifier; and
   switching circuit means for maintaining the output of the operational amplifier during the reset phase of the cycle close to the output level during the sampling phase of the system switching cycle, said switching circuit means including means for first, connecting said input capacitor to the signal source and said feedback capacitor in circuit from said one input to the output of said integrating amplifier, while isolating said compensating capacitor; and secondly, opening the circuitry from said signal source to said input capacitor, and from said feedback capacitor to said output, while concurrently closing the circuit including said compensating capacitor, and grounding the input to said input capacitor.

2. A switched capacitor system as defined in claim 1 further comprising additional switching circuit means connected to the other input of said operational amplifier for essentially duplicating the switching circuitry associated with said one input, to thereby compensate for switching circuit transients.

3. A switched capacitor system as defined in claim 1 including a plurality of additional input capacitors and associated switching circuitry connected essentially in parallel with the input capacitor of claim 1.

4. A switched capacitor system as defined in claim 3 wherein said input capacitors have values of capacitance which are related to one another by powers of two.

5. A switched capacitor system as defined in claim 4 wherein switching circuit means are associated with each input capacitor to selectively place it in parallel with the other input capacitors or to isolate it from the other input capacitors.

6. A switched capacitor system as defined in claim 1 further including switching means for selectively grounding the output side of said feedback capacitor.

7. A switched capacitor system as defined in claim 1 further including switching means of selectively grounding said compensating capacitor on the side thereof toward said input to said operational amplifier.

8. A low slew rate switched capacitor digital to analog conversion system including sampling and reset intervals during each cycle of operation of said system, comprising:
   an operational amplifier;
   an input capacitor array connected to one input of said operational amplifier;
   means for receiving an input signal and applying such signal to said input capacitor array;
   a feedback capacitor connected in circuit between the said one input and the output of said operational amplifier;
   a compensating capacitor connected in a second circuit between the output of said operational amplifier and said one input to said operational amplifier;
   switching circuit means for maintaining the output of the operational amplifier during the reset phase of the cycle close to the output level during the sampling phase of the system switching cycle, said switching circuit means including means for first, connecting said input capacitor to the signal source and said feedback capacitor in circuit from said one input to the output of said integrating amplifier, while isolating said compensating capacitor; and secondly, opening the circuitry from said signal source to said input capacitor, and from said feedback capacitor to said output, while concurrently closing the circuit including said compensating capacitor, and grounding the input to said input capacitor; and
   said input capacitor array including a plurality of parallel input capacitors, with the capacitors having capacitance values related to one another by powers of two, and associated switching circuitry for selectively either isolating individual input capacitors or placing them in parallel circuit relationship with the other input capacitors;
   whereby the output from said operational amplifier is an analog representation of a digital signal indicated by the array of parallel input capacitors.

9. A switched capacitor system as defined in claim 8 further including switching means for selectively grounding the output side of said feedback capacitor.

10. A switched capacitor system as defined in claim 7 further including switching means for selectively grounding said compensating capacitor on the side thereof toward said input to said operational amplifier.

11. A low slew rate switched capacitor system including sampling and reset intervals during each cycle of operation of said system, comprising:
an operational amplifier;
an input capacitor connected to the inverting input of said operational amplifier;
means for receiving a source of input signals to be amplified and applying such signals to said input capacitor;
a feedback capacitor connected in circuit between said inverting input and the output of said operational amplifier;
a compensating capacitor connected in a second circuit between the output of said operational amplifier and said inverting input to said operational amplifier; and
switching circuit means for maintaining the output of the operational amplifier during the reset phase of the cycle close to the output level during the sampling phase of the system switching cycle, said switching circuit means including means for sampling said input signals, and for alternately switching said feedback capacitor and said compensating capacitor in circuit between inverting input and the output of said operational amplifier.

12. A switched capacitor system as defined in claim 11 further comprising additional switching circuit means connected to the other input of said operational amplifier for essentially duplicating the switching circuitry associated with said one input, to thereby compensate for switching circuit transients.

13. A switched capacitor system as defined in claim 11 including a plurality of additional input capacitors and associated switching circuitry connected essentially in parallel with the input capacitor of claim 1.

14. A switched capacitor system as defined in claim 13 wherein said input capacitors have values of capacitance which are related to one another by powers of two.

15. A switched capacitor system as defined in claim 14 wherein switching circuit means are associated with each input capacitor to selectively place it in parallel with the other input capacitors or to isolate it from the other input capacitors.

16. A system as defined in claim 1 wherein said one input of said operational amplifier is the inverting input thereof.

17. A system as defined in claim 8 wherein said one input of said operational amplifier is the inverting input thereof.

* * * * *